United States Patent
Goyal et al.

(10) Patent No.: US 10,243,573 B1
(45) Date of Patent: Mar. 26, 2019

(54) PHASE SYNCRONIZING PLL OUTPUT ACROSS REFERENCE AND VCO CLOCK DOMAINS

(71) Applicant: TEXAS INSTRUMENTS INCORPORATED, Dallas, TX (US)

(72) Inventors: Jagdish Chand Goyal, Karnataka (IN); Peeyoosh Mirajkar, Karnataka (IN); Shankaranarayana Karantha, Karnataka (IN); Ashwin Ravisankar, Karnataka (IN); Srikanth Manian, Karnataka (IN); Srinivas Theertham, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/959,332

(22) Filed: Apr. 23, 2018

Related U.S. Application Data

(60) Provisional application No. 62/648,932, filed on Mar. 27, 2018.

(51) Int. Cl.
| | |
|---|---|
| H03L 7/16 | (2006.01) |
| G06F 1/12 | (2006.01) |
| H03D 3/24 | (2006.01) |
| H03L 7/18 | (2006.01) |
| H03L 7/099 | (2006.01) |
| H03L 7/085 | (2006.01) |

(52) U.S. Cl.
CPC ............... *H03L 7/18* (2013.01); *H03L 7/085* (2013.01); *H03L 7/099* (2013.01)

(58) Field of Classification Search
CPC ............ H03L 7/18; H03L 7/085; H03L 7/099
See application file for complete search history.

(56) References Cited

U.S. PATENT DOCUMENTS

| | | | | |
|---|---|---|---|---|
| 5,610,560 A | * | 3/1997 | Sauer | H03L 7/0991 331/11 |
| 9,503,109 B2 | * | 11/2016 | McLaurin | H03L 7/085 |
| 9,979,408 B2 | * | 5/2018 | Mayer | H03L 7/0891 |

* cited by examiner

*Primary Examiner* — Kenneth B Wells
(74) *Attorney, Agent, or Firm* — Andrew Viger; Charles A. Brill; Frank D. Cimino

(57) ABSTRACT

Frequency synthesis is based on phase synchronizing PLL output across REFERENCE and VCO clock domains (including outputs for multiple PLLs), based on an input (REF-Domain) SYNC signal (phase timing reference). A frequency synthesizer includes a VCO to generate VCO_clk and a PLL output circuit, such as a channel divider, to generate PLL_OUT based on VCO_clk (in the VCO-Domain). The VCO loop includes a PD to phase compare an input PD_clock based on REF_CLK, and a VCO feedback signal based on divided VCO_clk (NDIV_out). SYNC alignment circuitry generates a SYNC alignment signal based on SYNC, PD_clk, and NDIV_out (REF-Domain), which is used to synchronize the PLL output circuit and PLL_OUT to SYNC. If a reference divider generates PD_clk, the SYNC alignment circuitry generates a reset to SYNC-align the reference divider. If the VCO loop uses fractional divide, the SYNC alignment circuitry resets the fractional modulator to a known sequence.

16 Claims, 3 Drawing Sheets

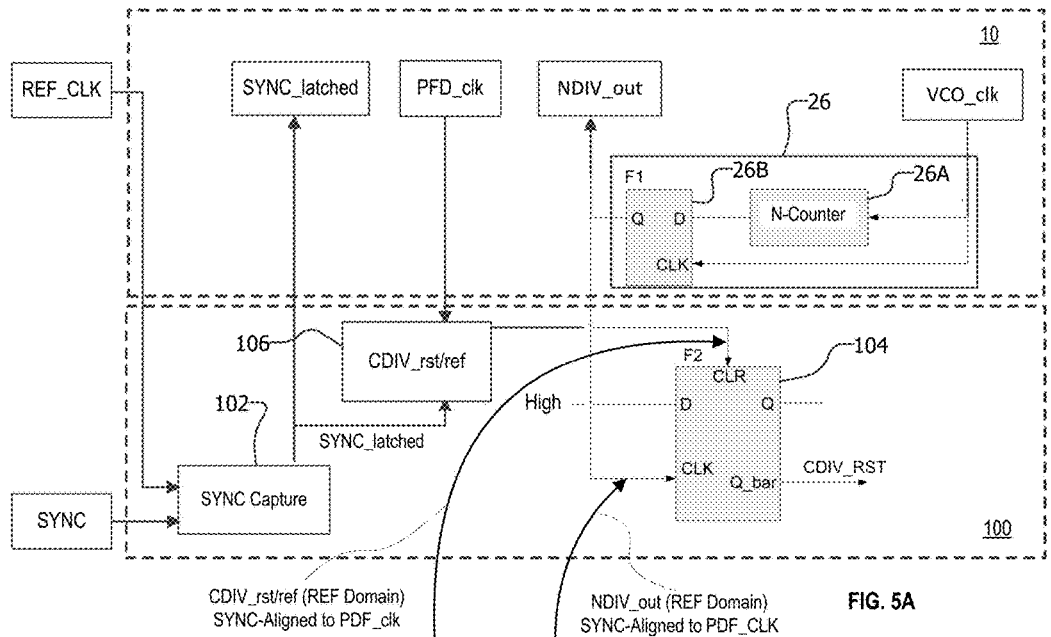
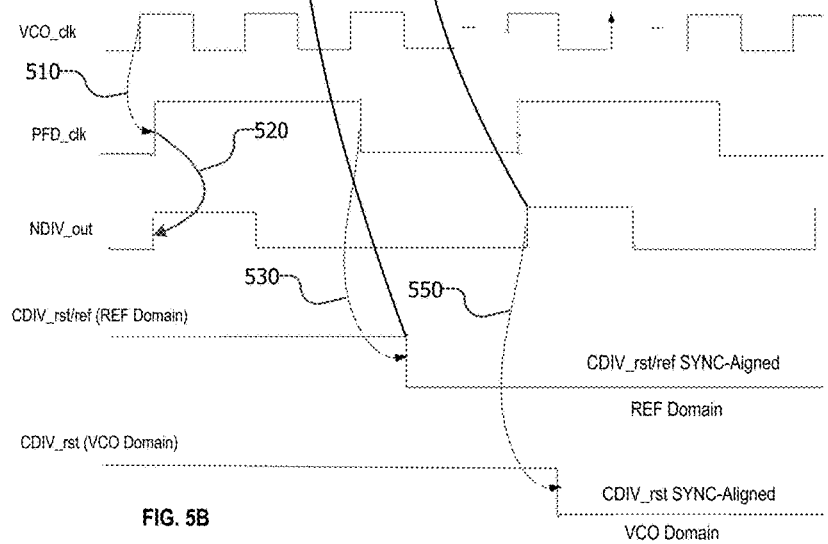
FIG. 5A
FIG. 5B

PHASE SYNCRONIZING PLL OUTPUT ACROSS REFERENCE AND VCO CLOCK DOMAINS

CROSS-REFERENCE TO RELATED APPLICATIONS

Priority is claimed under 37 CFR 1.78 and 35 USC 119(e) to U.S. Provisional Application 62/648,932, filed 2018 Mar. 27, which is incorporated by reference in its entirety

BACKGROUND

An example PLL architecture includes a VCO with a frequency control loop that generates a VCO_clock phase-locked to (phase-aligned with) an input reference clock REF-CLK at a loop-controlled frequency. A frequency synthesizer can include the PLL with an input reference divider (RDIV) which divides down REF_CLK for input to the PLL, and/or an output channel divider (CDIV) which divides down the PLL output VCO_clk to provide a channel-divided output PLL_CLK. The VCO loop includes a PD or PFD (phase or phase frequency detector) and a loop filter (such as a charge pump) that provide a VCO frequency tuning voltage/signal to the VCO to control VCO_clk frequency, and a feedback divider (NDIV) that divides VCO_clk to provide an NDIV_out signal to the PFD.

The PFD receives a PFD_clk based on REF_CLK, such as from RDIV, for phase comparison with the NDIV_out feedback from the VCO. Under lock conditions, the VCO loop ensures that the phases of the PFD inputs PFD_clk and NDIV_out (divided VCO_clk) are phase aligned, or the PFD generates a PFD error signal that is accumulated by the loop filter to provide the VCO tuning signal. NDIV effectively provides frequency multiplication, from the REF_CLK frequency to a selected VCO_clk frequency, which is divided back to the REF_CLK frequency (NDIV_out) for phase comparison by the PFD.

NDIV can be an integer N or fractional N.F divider, with the fractional value provided, for example, by a sigma-delta modulator providing fractional input to an integer NDIV (for fractional frequency multiplication). The post-VCO CDIV selectively divides VCO_clk to output the channel-divided PLL_OUT clock. NDIV and/or CDIV can be programmable.

Some applications require multiple clocks, each generated by a separate PLL, with the PLL clocks phase aligned across the multiple PLLs. Example applications are beam forming, phased array radar, and medical scanners. Also, 5G wireless MIMO (Multiple Input Multiple Output) applications require the Multiple Output clocks to be synchronized.

While this Background information references touch input for mobile/personal communication/computing devices, this Patent Disclosure is more generally directed to input button/keys based on touch technology.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for phase synchronizing PLL output across REFERENCE and VCO clock domains (including outputs for multiple PLLs), based on an input (REF-Domain) SYNC signal, including synchronizing (SYNC-aligning) a post-VCO output circuit (such as a channel divider) that generates PLL_OUT (VCO-Domain).

According to aspects of the Disclosure, phase synchronizing PLL output across REFERENCE and VCO clock domains based on an input REF-Domain SYNC signal can include: (a) receiving a reference clock (REF_CLK) with a REF_CLK frequency, and a synchronization signal (SYNC); (b) generating a VCO clock signal (VCO_clk), in response to a VCO frequency tuning signal corresponding to a phase error between an input PD clock signal (PD_clk) based on REF_CLK, and a VCO feedback signal (NDIV_out) corresponding to VCO_clk selectively divided down to a frequency corresponding to the REF_CLK frequency; (c) generating a PLL output clock (PLL_OUT) based on VCO_clk; (d) generating a SYNC alignment signal based on SYNC, PD_clk, and NDIV_out; and (e) synchronizing the generation of PLL_OUT with SYNC based on the SYNC alignment signal.

In other aspects of the Disclosure, a circuit for frequency synthesis can include input terminals to receive a reference clock (REF_CLK), and a synchronization signal (SYNC). PLL circuitry can include a VCO Loop to generate a VCO_clk, and a PLL output circuit to generate PLL_OUT based on VCO_clk. The VCO loop can include a phase detector (PD), voltage controlled oscillator (VCO), and feedback divider (NDIV). The VCO is responsive to a VCO frequency tuning signal to output a VCO clock signal (VCO_clk) with a controlled frequency derived from the REF_CLK frequency. The PD generates a phase error signal corresponding to a phase error between an input PD clock signal (PD_clock) based on REF_CLK, and a VCO feedback signal from NDIV (NDIV_out) corresponding to VCO_ clk selectively divided by NDIV down to a frequency corresponding to the REF_CLK frequency. A SYNC alignment block includes SYNC capture circuitry to latch SYNC (SYNC_latched), and SYNC alignment circuitry responsive to SYNC_latched, PD_clk, and NDIV_out to generate a SYNC alignment signal. The PLL output circuit is responsive to the SYNC alignment signal to synchronize PLL_OUT with the REF-Domain SYNC.

In other aspects of the disclosure, a system includes multiple frequency synthesizers, each including input terminals to receive a reference clock (REF_CLK), and a synchronization signal (SYNC). PLL circuitry can include a VCO Loop to generate a VCO_clk, and a PLL output circuit to generate PLL_OUT based on VCO_clk. The VCO loop can include a phase detector (PD), voltage controlled oscillator (VCO), and feedback divider (NDIV). The VCO is responsive to a VCO frequency tuning signal to output a VCO clock signal (VCO_clk) with a controlled frequency derived from the REF_CLK frequency. The PD generates a phase error signal corresponding to a phase error between an input PD clock signal (PD_clock) based on REF_CLK, and a VCO feedback signal from NDIV (NDIV_out) corresponding to VCO_clk selectively divided by NDIV down to a frequency corresponding to the REF_CLK frequency. A SYNC alignment block includes SYNC capture circuitry to latch SYNC (SYNC_latched), and SYNC alignment circuitry responsive to SYNC_latched, PD_clk, and NDIV_out to generate a SYNC alignment signal. The PLL output circuit is responsive to the SYNC alignment signal to synchronize PLL_OUT with the REF-Domain SYNC. The multiple frequency synthesizers each generates a respective PLL_OUT that is synchronized to the REF-Domain SYNC.

Other aspects and features of the invention claimed in this Patent Document will be apparent to those skilled in the art from the following Disclosure.

BRIEF DESCRIPTION OF THE DRAWINGS

FIGS. 5A/5B illustrate, for the example PLL/synthesizer design 10 of FIG. 1, an example timing sequence for generating, from the REF-Domain SYNC timing reference signal, a SYNC-alignment signal CDIV_rst to synchronize the post-VCO CDIV and PLL_OUT in the VCO-Domain, according to aspects of the Disclosure: FIG. 5A illustrates portions of the example PLL/synthesizer 10 and SYNC Alignment block 100 of FIG. 1; and FIG. 5B provides example timing signals, referenced to the SYNC Alignment block of FIG. 5A, illustrating the example timing sequence for generating the SYNC-alignment signal CDIV_rst, based on PFD_clk and NDIV_out, both synchronized to the REF-Domain SYNC, with the SYNC-alignment signal CDIV_rst used to synchronize, to the REF-Domain SYNC, a post-VCO output channel divider CDIV, and PLL_OUT in the VCO-Domain.

DETAILED DESCRIPTION

This Description and the Drawings constitute a Disclosure for phase synchronizing PLL output across REFERENCE and VCO clock domains (including outputs for multiple PLLs) based on an input SYNC signal (REF-Domain), including synchronizing (SYNC-aligning) a post-VCO output circuit (such as a channel divider) that generates PLL_OUT (VCO-Domain), including describing design examples, and illustrating various technical features and advantages.

In brief overview, frequency synthesis is based on phase synchronizing PLL output across REFERENCE and VCO clock domains (including outputs for multiple PLLs), based on an input (REF-Domain) SYNC signal (phase timing reference). A frequency synthesizer includes a VCO to generate VCO_clk and a PLL output circuit, such as a channel divider, to generate PLL_OUT based on VCO_clk (in the VCO-Domain). The VCO loop includes a PD to phase compare an input PD_clock based on REF_CLK, and a VCO feedback signal based on divided VCO_clk (NDIV_out). SYNC alignment circuitry generates a SYNC alignment signal based on SYNC, PD_clk, and NDIV_out (REF-Domain), which is used to synchronize the PLL output circuit and PLL_OUT to SYNC. If a reference divider generates PD_clk, the SYNC alignment circuitry generates a reset to SYNC-align the reference divider. If the VCO loop uses fractional divide, the SYNC alignment circuitry resets the fractional modulator to a known sequence.

That is, phase synchronizing PLL output across REFERENCE and VCO clock domains involves synchronizing the VCO loop to the REF-Domain SYNC, and then generating, based on the REF-Domain SYNC, a VCO-Domain SYNC-alignment signal for phase synchronizing a post-VCO PLL output circuit (such as a channel divider). Synchronizing the VCO loop can include, if the VCO signal path includes an input reference divider (RDIV), SYNC-aligning the input PD_clk, and, if the VCO loop includes feedback fractional divide (N.FDIV), resetting the fractional modulator to a known fractional-divide sequence.

Figure 1:
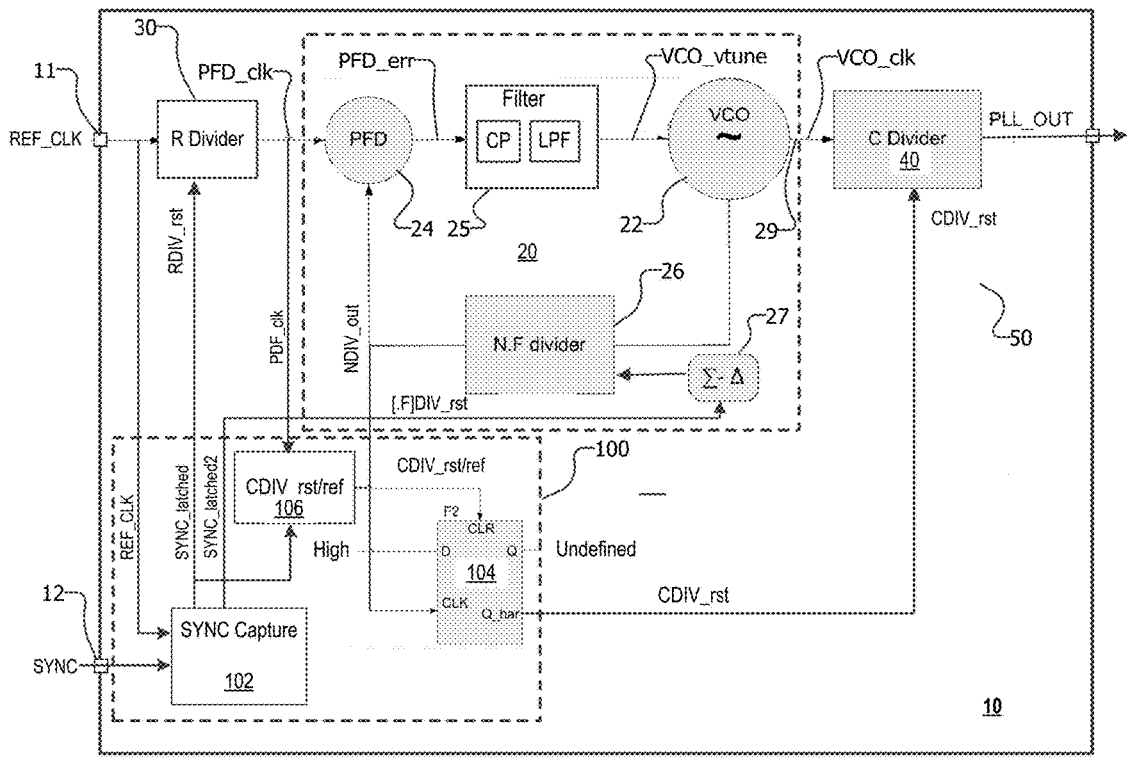
FIG. 1 illustrates an example frequency synthesizer 10 including an example PLL 20, and an example SYNC-Alignment Block 100, the PLL/synthesizer 10 receiving REF_CLK and SYNC, providing phase synchronization of PLL output across REF and VCO clock domains, based on an input SYNC signal, the VCO signal path can include an input reference R Divider (RDIV) 30, and an output channel-divider C Divider (CDIV) 40, the SYNC Alignment Block 100 generating, from the REF-Domain SYNC, a SYNC-alignment signal (CDIV_rst) to synchronize the post-VCO CDIV, and PLL_OUT in the VCO-Domain.

FIG. 1 illustrates an example frequency synthesizer 10, including an example PLL 20 with VCO 22, and an example SYNC-Alignment Block 100. The PLL/synthesizer 10 receives inputs REF_CLK 11 and a SYNC phase timing reference signal 12, generates a frequency-multiplied VCO_clk phase-aligned with REF_CLK, and outputs a PLL_OUT clock signal based on VCO_clk.

Frequency synthesizer 10 is configured for phase synchronization of PLL output across REFERENCE and VCO clock domains. According to aspects of the Disclosure, PLL output phase synchronization is based on the input SYNC signal (in the REF_CLK domain, or REF-Domain), and includes synchronizing (SYNC-aligning) a post-VCO output circuit (such as a channel divider) that generates PLL_OUT (in the VCO_clk domain or VCO-Domain). Phase synchronization according to the Disclosure can synchronize multiple PLL/synthesizer devices, each providing a PLL_OUT synchronized with the SYNC phase timing reference signal (see, FIG. 3).

The example PLL/synthesizer 10 includes in the VCO signal path, an input reference R Divider (RDIV) 30, and an output channel C Divider (CDIV) 40. RDIV 30 divides REF_CLK to provide a PFD_clk input to the PLL 20, which generates VCO_clk phase-aligned with PFD_clk. The post-VCO CDIV divides VCO_clk to generate PLL_OUT from VCO_clk (VCO-Domain).

If a reference divider RDIV 30 is included in the PLL signal path, it divides REF_CLK to provide the PFD_clk input to PLL 20 (PFD 24). According to aspects of the Disclosure, RDIV 30 is SYNC-aligned to synchronize PFD_clk to the REF-Domain SYNC. If a reference divider is not included in the PLL signal path, then the PFD_clk input to PLL 20 will be synchronized with REF_CLK.

CDIV 40 is representative of a post-PLL/VCO output circuit that operates in the VCO-Domain. According to aspects of the Disclosure, CDIV 40 is phase synchronized to the REF-domain SYNC with the SYNC-alignment signal (CDIV_rst), generated in the REF-Domain by the SYNC-Alignment Block 100.

The example PLL 20 includes VCO 22, and in the forward path, a PFD (phase or phase/frequency detector) 24 and loop filter 25, and in the feedback path, an N.F fractional divider 26. In the example PLL 20, loop filter 25 is a charge pump loop filter including a charge pump driven by a PFD error signal PFD_err, and a low-pass filter LPF that accumulates the PFD_err to provide a tuning signal VCO_vtune that tunes VCO_clk 29 in phase alignment with PFD_clk.

The example PLL 20 includes a fractional divider N.F Divider 26 can be set for integer divide (NDIV), or fractional divide (N.FDIV) using an example sigma-delta fractional modulator 27. For either integer or fractional divide, the N.F divider 26/27 divides a feedback VCO_clk to provide the feedback NDIV_out, which is the VCO_clk divided down to the REF_CLK frequency for phase comparison with PFD_clk in the PFD 24.

For fractional divide mode, according to aspects of the Disclosure, phase synchronizing the VCO loop to the SYNC requires resetting the fractional modulator. For the example sigma-delta fractional modulator 27, reset is to a known fractional-divide sequence based on a SEED value.

For the example PLL/synthesizer signal path, PFD 24 receives PFD_clk from RDIV 30 (divided REF_CLK), for phase comparison with NDIV_out from N.FDIV 26 (integer or fractional divided VCO_clk). Under lock conditions, the phases of the PFD inputs PFD_clk and NDIV_out are phase aligned, or the PFD generates the PFD error signal PFD_err that is accumulated by the loop filter 25 to provide a VCO tuning signal VCO_vtune.

The example SYNC Alignment Block 100 includes a SYNC capture block 102 to capture the input REF-Domain SYNC signal, using REF_CLK to latch SYNC with appropriate setup/hold timing. SYNC capture 102 outputs SYNC_latched (RDIV_rst) and SYNC_latched2 ([.F]DIV_rst) for SYNC-aligning the RDIV 30, and, for fractional mode, the feedback fractional N.FDIV 26/27. The SYNC-alignment signal CDIV_rst is illustratively generated with a D flip-flop 104.

The operation of the SYNC Alignment Block 100, and D Flip-Flop 104, including generating the SYNC-alignment signal CDIV_rst from the REF-Domain SYNC (SYNC_latched), to synchronize CDIV 40 and PLL_OUT in the VCO-Domain, is described in connection with the timing sequence diagrams in FIGS. 4 and 5B.

Figure 2:
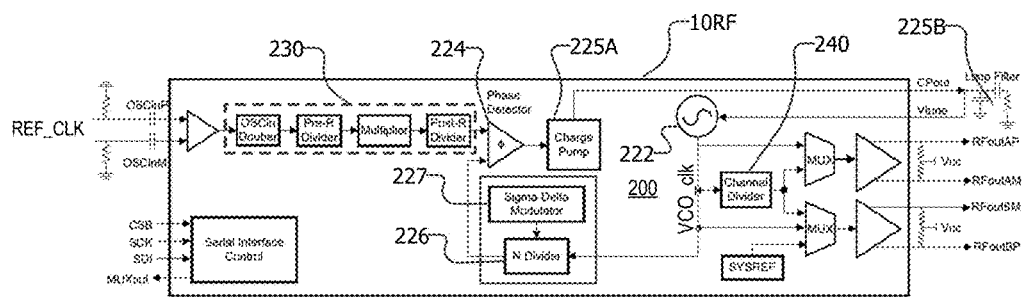
FIG. 2 illustrates an example RF frequency synthesizer 10RF including an example PLL/synthesizer 200 configured based on the example PLL/synthesizer design 10 of FIG. 1.

FIG. 2 illustrates an example RF frequency synthesizer 10RF, including an example PLL 200. RF frequency synthesizer 10RF can be configured for phase synchronization of PLL output across REFERENCE and VCO clock domains, according to the Disclosure.

The input/reference path receives REF_CLK, which is divided by divider logic 230. The divider logic 230 includes two dividers (Pre and Post) that are the equivalent of the R Divider 30 in FIG. 1, and a programmable multiplier (for spur reduction), which does not require SYNC alignment/synchronization.

The PLL 200 with VCO 222 includes a phase detector 224, loop filter 225A/225B, and fractional N Divider 226/227. The PD phase-compares the input from the Post-R divider (PD_clk) with the divided VCO_clk from the fractional N Divider 226/227 (NDIV_out), and generates a phase-error correction current to the loop filter. For the example RF frequency synthesizer 10RF (example PLL 200), the charge pump loop filter is configured with a charge pump 225A and an external loop filter 225B (alternately, the loop filter can be implemented internal), providing in response to an accumulated charge pump correction current CPout, a Vtune VCO frequency tuning signal to VCO 222, to phase lock the VCO to the specified VCO_clk.

The PLL output circuit is a multiplexed channel divider 240, providing PLL_OUT through differential RF output buffers.

Figure 3:
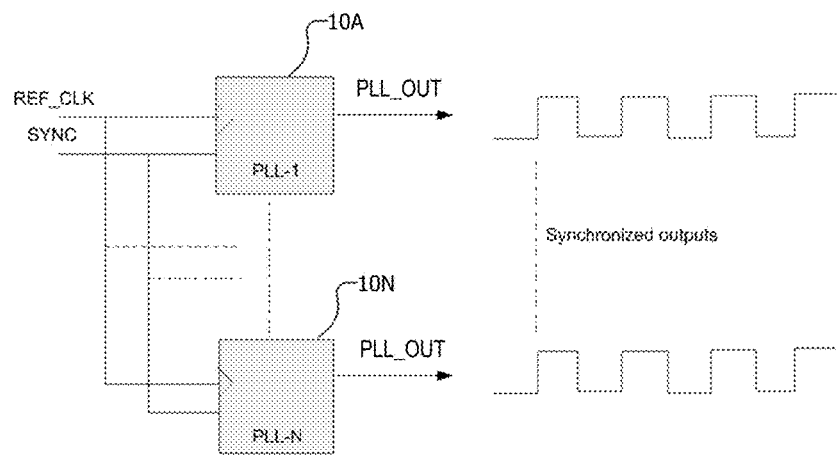
FIG. 3 illustrates an example system with multiple PLL/synthesizer devices 10A-10N, each based on the example PLL/synthesizer design 10 of FIG. 1, each PLL/synthesizer device phase synchronizing its PLL_OUT based on SYNC, according to the Disclosure.

FIG. 3 illustrates an example system with multiple PLL/synthesizer devices 10A-10N, based on the example PLL/synthesizer design 20 of FIG. 1. Each PLL/synthesizer device receives REF_CLK and SYNC. Each PLL/synthesizer 10A-10N outputs a PLL_OUT, synchronized to the SYNC timing reference signal according to the Disclosure.

Figure 4:
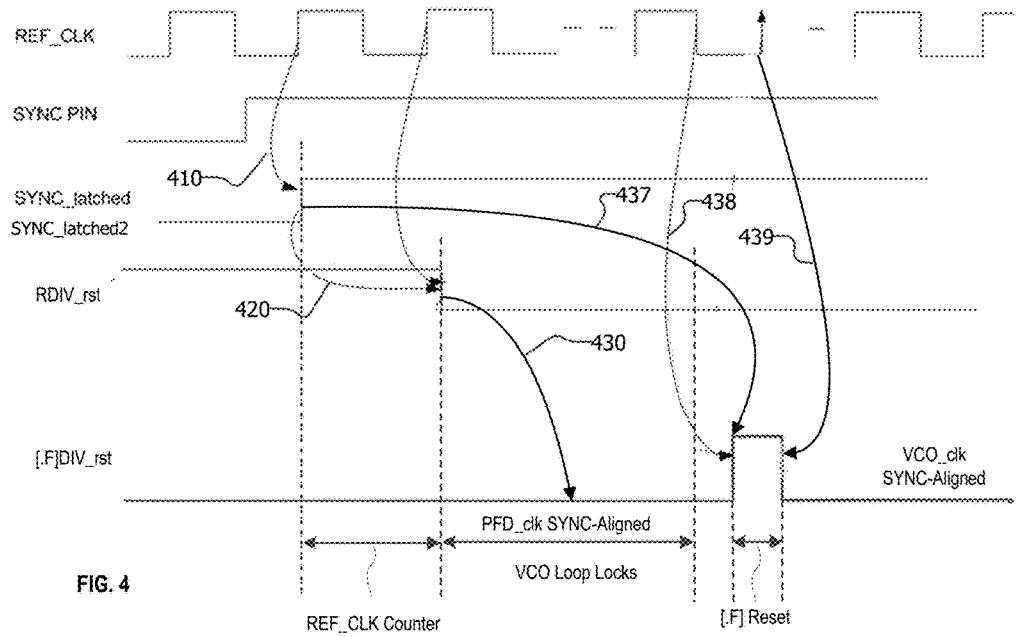
FIG. 4 provides, for the example PLL/synthesizer design 10 of FIG. 1, example timing signals illustrating an example timing sequence for synchronizing VCO_clk to the REF-Domain SYNC (SYNC_latched/latched2), including resetting RDIV with RDIV_rst (420), which synchronizes PFD_clk, and then, for fractional mode, after the VCO loop locks (430), resetting the fractional modulator with [.F]DIV_rst (437, 438/439), to fully synchronize VCO_clk to SYNC.

FIG. 4 provides, for the example PLL/synthesizer design of FIG. 1, example timing signals illustrating an example timing sequence for synchronizing the PLL/VCO generated VCO_clk to the REF-Domain SYNC timing reference signal, according to aspects of the Disclosure.

Referring also to FIG. 1, this timing sequence is implemented in (controlled by) the SYNC Alignment block 100.

In FIG. 4, REF_CLK is illustrated in reference to the assertion (high) of SYNC received through the SYNC pin (SYNC input 12). SYNC is latched 410 on the active edge of REF_CLK after SYNC is active (based on defined setup/hold times).

SYNC is latched by SYNC Capture 102 in the SYNC Alignment Block 100. The example SYNC Capture block 102 generates two SYNC capture signals: SYNC_latched and SYNC_latched2. As REF_CLK is a low frequency signal relative to the VCO_clk (for example, in the range of a few MHz), the timing requirement on latching SYNC is relaxed.

The example inclusion of reference divider RDIV 30 in the input PLL signal path to generate a divided PFD_clk input to the PLL 20 requires synchronizing RDIV to SYNC, to SYNC-align PFD_clk. SYNC Capture 102 provides SYNC_latched as an RDIV reset signal RDIV_rst that resets RDIV based on SYNC_latched, which then outputs a SYNC-aligned PFD_clk. For example, SYNC_latched can trigger a counter to generate RDIV_rst to reset RDIV.

After PFD_clk is SYNC-aligned based on RDIV_reset, the PLL/VCO loop 20 is allowed to lock (FIG. 4, 430), to align NDIV_out from N.FDIV 26 to PFD_CLK, for example, by aligning an N-counter in N.FDIV to PFD_clk. Allowing the VCO loop to lock to the SYNC-aligned PFD_clk ensures no cycle slips after the sigma-delta fractional modulator is reset, as described next.

For the example PLL/VCO 20, including a fractional N.FDIV 26 with sigma-delta fractional modulator 27, the PLL/VCO loop locks (FIG. 4, 430) with a random phase. Fully synchronizing VCO_clk to SYNC requires resetting the fractional modulator after the initial PLL/VCO lock.

SYNC Capture 102 generates SYNC_latched2, which provides [.F]DIV_rst to the sigma-delta fractional modulator 27, as illustrated by FIG. 4, 437. For the example sigma-delta fractional modulator, reset is to a known SEED value after the PLL/VCO loop is locked, to ensure against cycle slip after synchronizing the fractional modulator (i.e., resetting ensures that the sigma-delta modulator outputs a known sequence based on the reset SEED value). The sigma-delta fractional modulator is reset for at least one REF_CLK cycle, FIG. 4, 438/439, to get a known fractional-divide sequence for a particular SEED value.

Note that, with reference to FIGS. 4, 430 and 437, resetting the sigma-delta fractional modulator before the PLL/VCO loop is locked, can result in cycle slips. Cycle slip occurs when the phase error at the PFD input accumulates beyond 2 τ and the loop locks to next REF_CLK edge, because the PLL/VCO can be running at different frequency than the required final frequency. Also the number of cycle slips cannot be predicted because it depends on the loop dynamics and frequency difference between initial and final VCO_clk frequency. Even if the fractional modulator output sequence is known, because the N.FDIV (N-counter) can be aligned with a different REF_CLK edge, the VCO_clk output cannot be ensured to be synchronized with SYNC.

After the fractional modulator 27 is reset with no cycle slips, FIGS. 4, 437 and 438/439, the PLL/VCO 20 and VCO_clk are fully synchronized to SYNC.

Referring to FIG. 1, with VCO_clk synchronized, the PLL output circuit CDIV 40 that channel-divides VCO_clk to generate the PLL/synthesizer output PLL_OUT is synchronized. This final synchronization of PLL_OUT in the VCO-Domain requires SYNC-aligning the CDIV 40 with a CDIV reset signal generated from the REF-Domain SYNC timing reference signal. Note that VCO_clk frequency can be in the tens of GHz, while SYNC is in the REF_CLK domain can be in the tens of MHz.

FIGS. 5A/5B illustrate, for the example PLL/synthesizer design 10 of FIG. 1, an example timing sequence for generating, from the REF-Domain SYNC timing reference signal, a SYNC-alignment signal to synchronize the post-VCO PLL output CDIV and PLL_OUT in the VCO-Domain, according to aspects of the Disclosure.

FIG. 5A illustrates portions of the example PLL/synthesizer 10 and SYNC Alignment block 100 of FIG. 1. FIG. 5B provides example timing signals, referenced to the SYNC Alignment block of FIG. 5A, illustrating the example timing sequence for generating the SYNC-alignment signal (CDIV_rst) from the REF-Domain SYNC.

With the PLL/VCO loop synchronized, VCO_clk, PFD_clk, and NDIV_out are synchronized with the REF-Domain SYNC (510, 520). For the example SYNC Alignment block 100, PFD_clk and NDIV_out, both synchronized to REF-Domain SYNC, provide inputs to the D flip-flop (DFF) 104.

PFD_clk is input to a CDIV_rst/ref circuit 106, that provides a REF-Domain CDIV_rst/ref signal as the DFF 104 CLR input. CDIV_rst/ref can be generated (530) on the negative edge of PFD_CLK to ensure a one-half cycle timing closure for the DFF 104.

NDIV_out provides the DFF CLK input that clocks out (550) the SYNC-alignment signal CDIV_rst (DFF Q_bar), based on the REF-Domain CDIV_rst/ref on CLR. The example NDIV 26 includes an N-counter 26A, and a D Flip-Flop (DFF) 26B to synchronize the N-counter output (NDIV_out) to the feedback VCO_clk, to nullify noise generated by the NDIV). DFF 26A (Q) provides NDIV_out to the PFD.

CDIV_rst provides a VCO-Domain SYNC-alignment signal to reset the post-VCO output CDIV, SYNC-aligning CDIV and PLL_OUT to the REF-Domain SYNC timing reference signal.

As a result, the PLL/synthesizer output PLL_OUT is synchronized to the to the REF-Domain SYNC timing reference signal. In effect, PLL_OUT is phase synchronized to SYNC independent of the divide values for RDIV, N.FDIV, and the post-VCO CDIV (VCO-Domain).

FIGS. 5A and 5B illustrate an example implementation for generating the VCO-Domain CDIV_rst SYNC-alignment signal using DFF 104. Another example implementation is, instead of providing CDIV_rst/ref to the DFF 104 CLR, CDIV_rst/ref can be sampled on the negative edge of PFD_CLK, and then fed as the D input of DFF 104.

Referring back to FIG. 3, phase synchronizing the PLL/synthesizer PLL_OUT to the REF-Domain SYNC phase timing signal according to the Disclosure, can be used to synchronize multiple PLL/synthesizers, each with the same REF_CLK and SYNC pulse inputs. For the example PLL/synthesizer design including an input path RDIV, and a PLL/VCO fractional divider N.FDIV, each PLL synthesizer is synchronized to the SYNC pulse based on first synchronizing PFD_clk (RDIV reset). After PLL/VCO lock, the fractional modulator is reset to a known fractional-divide sequence across all PLL/synthesizer devices—after the fractional modulator is reset, if there are no cycle slips, the PLL/VCO output VCO_clk is synchronized across the multiple PLLs. Finally, after VCO_clk is synchronized, the post-VCO PLL output channel divider CDIV is synchronized with the SYCN-alignment signal CDIV_rst generated by the SYNC Alignment block, based on the REF-Domain SYNC timing reference signal.

Synchronizing PLL/synthesizer output with an input SYNC timing reference signal according to the Disclosure, based on generating in the REF-Domain a SYNC-alignment signal for synchronizing a post-VCO output circuit in that generates PLL_OUT in the VCO-Domain has a number of advantages. Fractional PLL/VCO outputs can be phase synchronized. REF_CLK clock need not be adjusted. The cost of an XO or clock buffers can be reduced. A post-VCO channel divider need not be included in a feedback loop. Overall phase noise performance is not compromised (i.e., quantization noise is not increased). The SYNC pulse used for synchronization requires timing closure only in the REF_CLK domain. Outputs of multiple PLLs can be synced together without requiring any master device.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit for frequency synthesis, comprising:
input terminals to receive a reference clock (REF_CLK) with a REF_CLK frequency, and a synchronization signal (SYNC);
PLL circuitry including:
  a VCO Loop including a phase detector (PD), voltage controlled oscillator (VCO), and feedback divider (NDIV),
    the VCO responsive to a VCO frequency tuning signal to output a VCO clock signal (VCO_clk) with a controlled frequency derived from the REF_CLK frequency,
    the PD to generate a phase error signal corresponding to a phase error between:
      an input PD clock signal (PD_clk) based on REF_CLK, and
      a VCO feedback signal from NDIV (NDIV_out) corresponding to VCO_clk selectively divided by NDIV down to a frequency corresponding to the REF_CLK frequency,
    the VCO frequency tuning signal based on the phase error signal; and
  a PLL output circuit coupled to the VCO, to generate a PLL output clock (PLL_OUT) based on VCO_clk;
a REF_CLK domain (REF-Domain) and a VCO_clk domain (VCO-Domain), the REF-Domain including REF_CLK, SYNC, PD_clk, and NDIV_out, the VCO-Domain including VCO_clk and PLL_OUT; and
a SYNC alignment block, including:
  SYNC capture circuitry to latch SYNC (SYNC_latched), and SYNC alignment circuitry responsive to SYNC_latched, PD_clk, and NDIV_out to generate a SYNC alignment signal;
the PLL output circuit responsive to the SYNC alignment signal to synchronize PLL_OUT with the REF-Domain SYNC.

2. The circuit of claim 1, wherein:
the circuit further comprises a reference divider (RDIV) to selectively divide REF_CLK to generate the PD_clk; and
the SYNC alignment circuitry to generate an RDIV reset signal to reset RDIV, and synchronize PD_clk with SYNC.

3. The circuit of claim 1, wherein:
NDIV is a fractional divider [N.F]DIV with an integer divider NDIV and a fractional modulator; and
the SYNC alignment circuitry further generates a fractional modulator reset signal based on SYNC to reset the fractional modulator to a known fractional-divide sequence, and thereby synchronize VCO_clk with SYNC.

4. The circuit of claim 1, wherein:
the PLL output circuit is a channel divider circuit (CDIV) to generate PLL_OUT be selectively dividing VCO_clk; and
CDIV is responsive to the SYNC alignment signal to reset, and thereby synchronize PLL_OUT with SYNC.

5. The circuit of claim 1, wherein:
the SYNC alignment circuitry comprises a D flip-flop that receives as CLR input a REF-Domain signal based on SYNC_latched, and a CLK input based on NDIV_out, and generates the SYNC alignment signal.

6. The circuit of claim 1, wherein the circuit is a PLL/synthesizer, and wherein:
the PLL/synthesizer is linked to at least a second PLL/synthesizer;
each PLL/synthesizer receiving REF_CLK and SYNC, and providing a respective PLL_OUT;
each PLL/synthesizer generating its respective PLL_OUT synchronized with SYNC.

7. A system including multiple frequency synthesizers, each comprising:
input terminals to receive a reference clock (REF_CLK) with a REF_CLK frequency, and a synchronization signal (SYNC);
PLL circuitry including:
a VCO Loop including a phase detector (PFD), voltage controlled oscillator (VCO), and feedback divider (NDIV),
the VCO responsive to a VCO frequency tuning signal to output a VCO clock signal (VCO_clk) with a controlled frequency derived from the REF_CLK frequency,
the PD to generate a phase error signal corresponding to a phase error between
an input PD clock signal (PD_clk) based on REF_CLK, and
a VCO feedback signal from NDIV (NDIV_out) corresponding to VCO_clk selectively divided by NDIV down to a frequency corresponding to the REF_CLK frequency,
the VCO frequency tuning signal based on the phase error signal; and
a PLL output circuit coupled to the VCO, to generate a PLL output clock (PLL_OUT) based on VCO_clk;
a REF_CLK domain (REF-Domain) and a VCO_clk domain (VCO-Domain), the REF-Domain including REF_CLK, SYNC, PD_clk, and NDIV_out, the VCO-Domain including VCO_clk and PLL_OUT; and
a SYNC alignment block, including:
SYNC capture circuitry to latch SYNC (SYNC_latched), and
SYNC alignment circuitry responsive to SYNC_latched, PD_clk, and NDIV_out to generate a SYNC alignment signal;
the PLL output circuit responsive to the SYNC alignment signal to synchronize PLL_OUT with the REF-Domain SYNC;
the multiple frequency synthesizers each generating a respective PLL_OUT that is synchronized to SYNC.

8. The system of claim 7, wherein:
the frequency synthesizer further comprises a reference divider (RDIV) to selectively divide REF_CLK to generate the PD_clk; and
the SYNC alignment circuitry to generate an RDIV reset signal to reset RDIV, and synchronize PD_clk with SYNC.

9. The system of claim 7, wherein:
NDIV is a fractional divider [N.F]DIV with an integer divider NDIV and a fractional modulator; and
the SYNC alignment circuitry further generates a fractional modulator reset signal based on SYNC to reset the fractional modulator to a known fractional-divide sequence, and thereby synchronize VCO_clk with SYNC.

10. The system of claim 7, wherein:
the PLL output circuit is a channel divider circuit (CDIV) to generate PLL_OUT be selectively dividing VCO_clk; and
CDIV is responsive to the SYNC alignment signal to reset, and thereby synchronize PLL_OUT with SYNC.

11. The system of claim 7, wherein:
the SYNC alignment circuitry comprises a D flip-flop that receives as CLR input a REF-Domain signal based on SYNC_latched, and a CLK input based on NDIV_out, and generates the SYNC alignment signal.

12. A method of frequency synthesis, comprising:
receiving a reference clock (REF_CLK) with a REF_CLK frequency, and a synchronization signal (SYNC);
generating a VCO clock signal (VCO_clk), in response to a VCO frequency tuning signal corresponding to a phase error between:
an input PD clock signal (PD_clk) based on REF_CLK, and
a VCO feedback signal (NDIV_out) corresponding to VCO_clk selectively divided down to a frequency corresponding to the REF_CLK frequency;
generating a PLL output clock (PLL_OUT) based on VCO_clk;
generating a SYNC alignment signal based on SYNC, PD_clk, and NDIV_out; and
synchronizing the generation of PLL_OUT with SYNC based on the SYNC alignment signal.

13. The method of claim 12, further comprising:
selectively dividing REF_CLK to generate the PD_clk; and
generating an RDIV reset signal to synchronize the generation of PD_clk with SYNC.

14. The method of claim 12, wherein:
the VCO feedback signal NDIV_out is generated by a fractional divider including an integer divider and a fractional modulator; and the method further comprises generating a fractional modulator reset signal based on SYNC to reset the fractional modulator to a known fractional-divide sequence.

15. The method of claim 12, wherein:

PLL_OUT is generated by selectively dividing VCO_clk with a channel divider (CDIV); and the method further comprising generating a CDIV reset signal to reset CDIV based on SYNC.

16. The method of claim 12, wherein:

the method is used in a system with multiple frequency synthesizers, each receiving REF_CLK and SYNC, and providing a respective PLL_OUT;

each frequency synthesizer generating its respective PLL_OUT synchronized with SYNC.

* * * * *